United States Patent
Lee et al.

(10) Patent No.: US 6,257,857 B1
(45) Date of Patent: Jul. 10, 2001

(54) MOLDING APPARATUS FOR FLEXIBLE SUBSTRATE BASED PACKAGE

(75) Inventors: Shih-Chang Lee, Kaohsiung Hsien; Gwo Liang Weng, Kaohsiung, both of (TW)

(73) Assignee: Advanced Semiconductor Engineering, Inc., Taiwan (TW)

( * ) Notice: Subject to any disclaimer, the term of this patent is extended or adjusted under 35 U.S.C. 154(b) by 0 days.

(21) Appl. No.: 09/494,649

(22) Filed: Jan. 31, 2000

(51) Int. Cl.[7] .............................. B29C 45/14; H01L 21/58
(52) U.S. Cl. ............... 425/121; 264/272.14; 264/272.17; 425/123; 425/127; 425/544; 425/588
(58) Field of Search ..................... 425/121, 123, 425/127, 588, 544; 264/272.14, 272.17

(56) References Cited

U.S. PATENT DOCUMENTS

| | | | |
|---|---|---|---|
| 4,504,435 | * 3/1985 | Orcutt | 264/272.17 |
| 4,900,501 | 2/1990 | Saeki et al. | 264/272.17 |
| 4,983,110 | 1/1991 | Yoshida et al. | 425/116 |
| 5,484,274 | * 1/1996 | Neu | 425/121 |
| 5,866,949 | 2/1999 | Schueller | 257/778 |
| 5,980,683 | * 11/1999 | Beck et al. | 264/272.17 |
| 6,173,490 | * 1/2001 | Lee et al. | 264/272.14 |

FOREIGN PATENT DOCUMENTS

| | | | |
|---|---|---|---|
| 960097 | * 6/1964 | (GB) | 264/272.14 |
| 62-261414 | * 11/1987 | (JP) | 425/544 |
| 3-250635 | * 11/1991 | (JP) | 264/272.17 |
| 5-138699 | * 6/1993 | (JP) | 264/272.14 |
| 6-106567 | * 4/1994 | (JP) | 425/588 |

* cited by examiner

*Primary Examiner*—Robert Davis

(57) ABSTRACT

A molding apparatus for use in forming a flexible substrate based package comprises a plurality of pots. Two flexible substrates are installed at two sides of the pots. A plurality of sets of chips mounted on the upper surface of the substrate wherein each set of chips is in an array arrangement. The molding apparatus further comprises a plurality of runners. Each runner independently extends from one side of the pot to one side of the substrate, and connects to a cavity of a upper part of a mold disposed on the substrate through a gate. The present invention characterized in that, the molding apparatus is provided with a first communication channel formed corresponding to one side of the substrate and a second communication channel formed corresponding to the other side of the substrate. The first and the second communication channels interconnect the cavities at two opposite sides thereof. Therefore, the molded product removed from the mold has a first and a second connection bar, which form interconnection at two opposite sides of each unit package body thereby integrating all unit package bodies, and thereby enhancing the mechanical strength of the molded product.

2 Claims, 5 Drawing Sheets

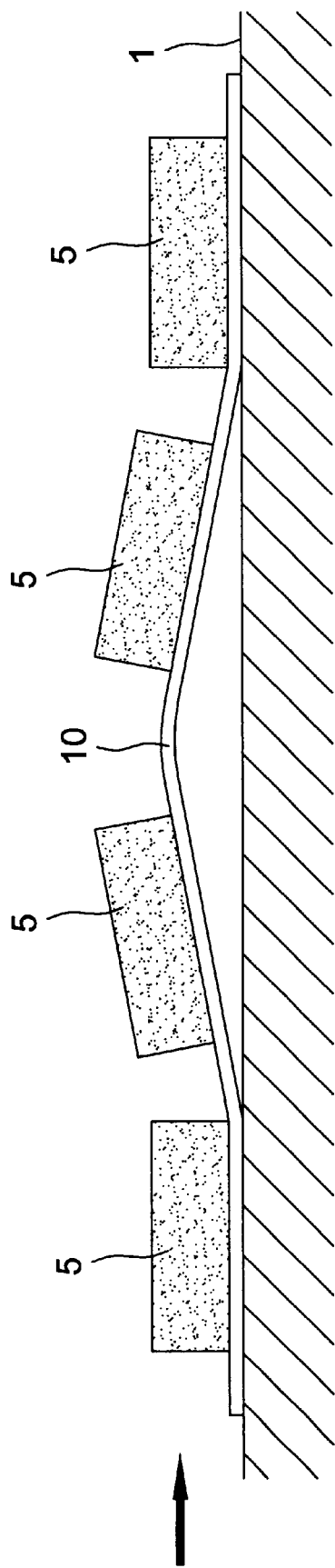
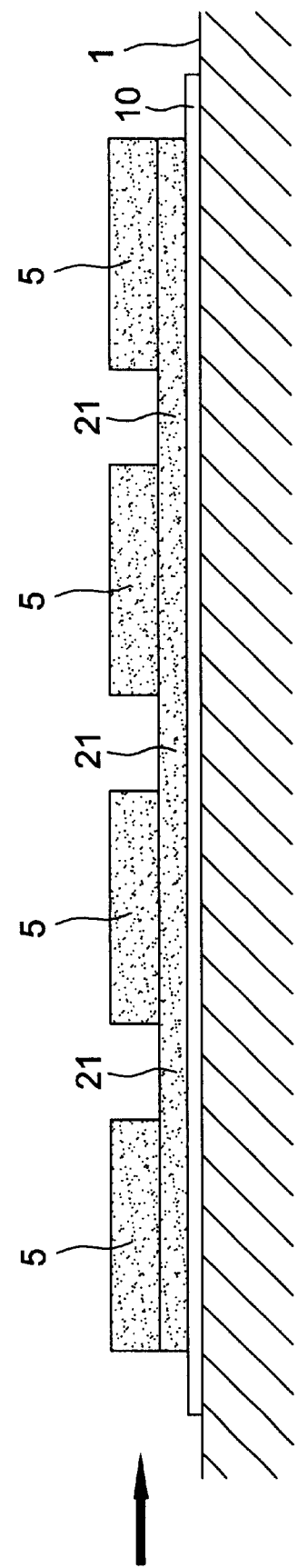

MOLDING APPARATUS FOR FLEXIBLE SUBSTRATE BASED PACKAGE

BACKGROUND OF THE INVENTION

1 Field of the Invention

This invention generally relates to a molding method and a molding apparatus for fabricating a semiconductor chip package, and more particularly to a molding method and a molding apparatus for a flexible substrate based semiconductor chip package.

2. Description of the Related Art

As electronic devices have become more smaller and thinner, the velocity and the complexity of IC chip become more and more higher. Accordingly, a need has arisen for higher package efficiency. To meet the need, the flexible substrate based ball grid array (BGA) technology has been developed by the semiconductor industry.

FIG. 1 illustrates a molding apparatus for a conventional flexible substrate based BGA package. The molding apparatus comprises a plurality of pots 2. Two substrates 20 are placed at two sides of the pots 2 for supporting a plurality of sets of chips 12 wherein each set of chips 12 are in an array arrangement. Each chip 12 is electrically connected to the substrate 10 through a plurality of bonding wires (not shown). The runner 3 independently extends from one side of the pot 2 to the corner of the substrate 10, and connects to the upper part of a mold disposed on the substrate 10 through a gate 4. Under the pressure created by the plunger 15, the molding compound is forced out of the pot 2 and then passes through the runner 3 and the gate 4 to enter the cavity 11 of the upper part of the mold. When the molding compound fills the cavity 11, the plunger 15 stands still for a predetermined time until the molding compound cures. Then the plunger 15 is raised, the upper part of the mold is opened, and the molded product is removed from the mold. After subsequent processing steps including post-curing, marking, ball mounting and sawing, the singulated substrate based BGA packages are obtained.

FIG. 2a shows a molded product removed from the upper part of the mold. Each set of semiconductor chips 12 on the substrate 10 constitutes an array unit. Each array unit is encapsulated in a unit package body 5. As shown in FIG. 2a, four unit package bodies 5 are individually formed on the substrate 10 and are separated from each other without any connection. Referring to FIG. 2b, the molded product is typically transferred from one processing station to another through sucking at the top surfaces of some of the unit package bodies 5 by suckers 7 during the subsequent processing steps discussed above. However, since the flexible substrate 10 is rather thin (typically smaller than 0.21 mm), the strength of the flexible substrate 10 is too weak to sustain the weight of the unit package bodies 5. When suckers 7 suck at the top surfaces of some of the unit package bodies 5, the weight of the unit package bodies 5 without being sucked will make the flexible substrate 10 bend down. Further, as shown in FIG. 2c, since the mechanical strength of the flexible substrate 10 is not sufficient, a portion of the substrate 10 tends to warp when the substrate 10 with all the molded products thereon is moved along a work surface 1. This adversely affects subsequent processing steps such as post-curing, marking, ball mounting and sawing, even results in peeling between the unit package bodies 5 and the flexible substrate 10, thereby causing damage to the chip 12, traces on the flexible substrate 10, or bonding wires therebetween. As a result, yield losses increase resulting in an increase in manufacturing costs.

SUMMARY OF THE INVENTION

It is a primary object of the present invention to provide a molding method and a molding apparatus for fabricating a flexible substrate based package. More specifically, the molded product of the molding method and molding apparatus has a significantly stronger mechanical strength thereby allowing easy manipulation and processing during the subsequent processing steps such as post-curing, marking, ball mounting and sawing.

It is another object of the present invention to provide a molding method and a molding apparatus for fabricating a flexible substrate based package, which prevent peeling between the package body and the flexible substrate, and thus avoid causing damage to the chip, traces on the flexible substrate, or bonding wires therebetween thereby improving the product yield.

The molding apparatus in accordance with the present invention comprises a plurality of pots. Two flexible substrates are placed at two sides of the pots. A plurality of sets of chips mounted on the upper surface of the substrate wherein each set of chips is in an array arrangement. The molding apparatus further comprises a plurality of runners. Each runner independently extends from one side of the pot to one side of the substrate, and connects to a cavity of a upper part of a mold disposed on the substrate through a gate. Under the pressure created by a plunger, the molding compound is forced out of the pot and then passes through the runner and the gate to enter the cavity of the upper part of the mold. According to the present invention, the molding apparatus is provided with a first communication channel formed corresponding to one side of the substrate and a second communication channel formed corresponding to the other side of the substrate. The first and the second communication channels interconnect the cavities at two opposite sides thereof. Therefore, the molded product removed from the upper part of the mold has a first and a second connection bar, which form interconnection at two opposite sides of each unit package body thereby integrating all unit package bodies, and thereby enhancing the mechanical strength of the molded product. It is rather easy to manipulate the molded product of the present invention during processing steps such as post-curing, marking, ball mounting and sawing. Further, the strength of the molded product is significantly increased since two opposing connection bars respectively interconnect two opposite sides of each unit package body on the flexible substrate. This significantly suppresses peeling between the package body and the flexible thereby avoiding damaging the chip, traces on the flexible substrate, or bonding wires therebetween, and thereby improving the product yield.

BRIEF DESCRIPTION OF THE DRAWING

Other objects, advantages, and novel features of the invention will become more apparent from the following detailed description when taken in conjunction with the accompanying drawings.

FIG. 2c is a schematic sectional view of the molded product of FIG. 2a being moved along a work surface showing the warpage of the flexible substrate;

FIG. 6 is a schematic sectional view of the molded product of FIG. 4 being moved along a work surface showing no warpage of the flexible substrate.

DETAILED DESCRIPTION OF THE PREFERRED EMBODIMENT

Figure 1:
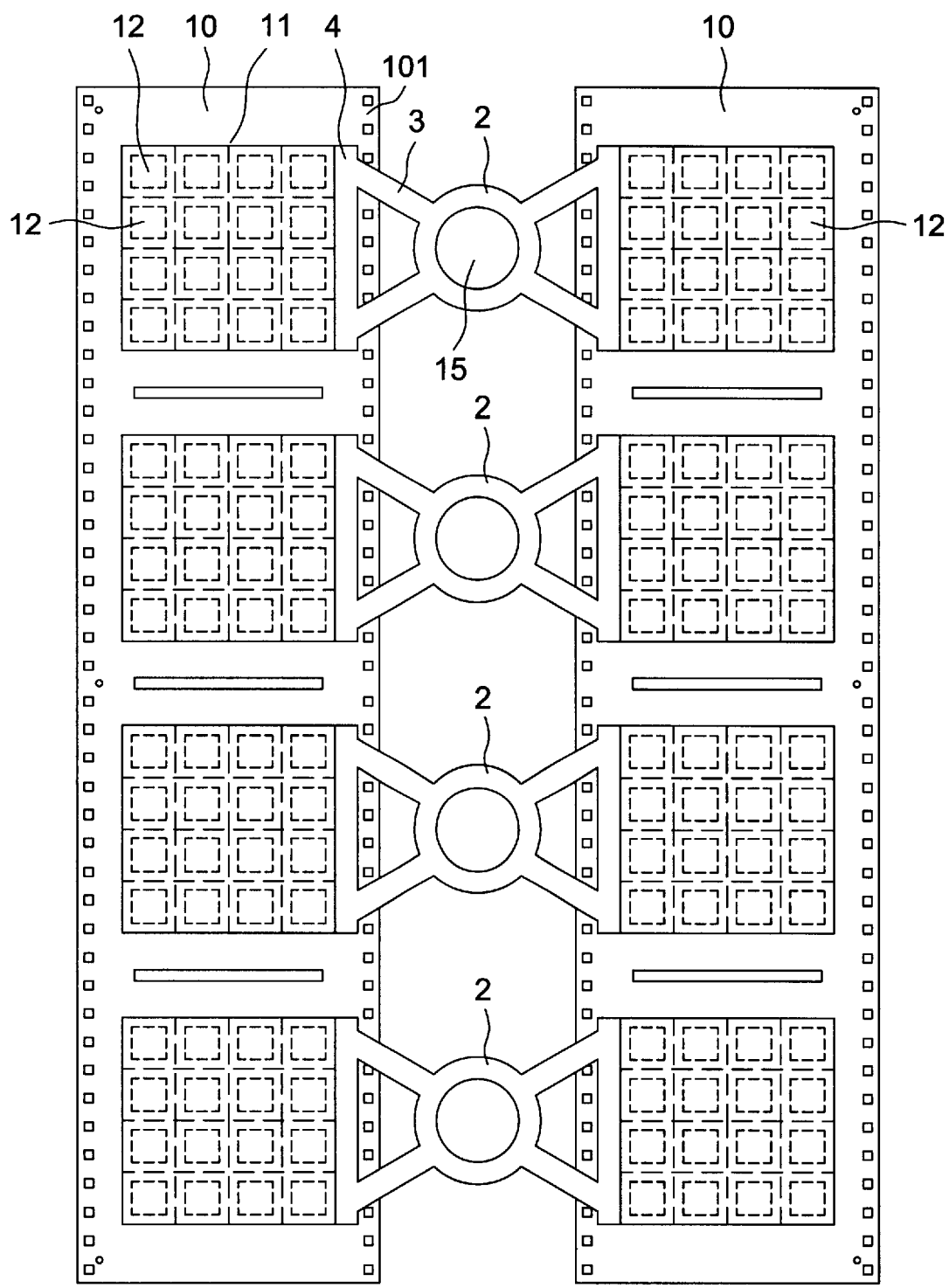
FIG. 1 is a top plan view of a plurality of sets of chips respectively mounted on two flexible substrates installed in a conventional molding apparatus for a conventional flexible substrate based BGA package.
Figure 2B:
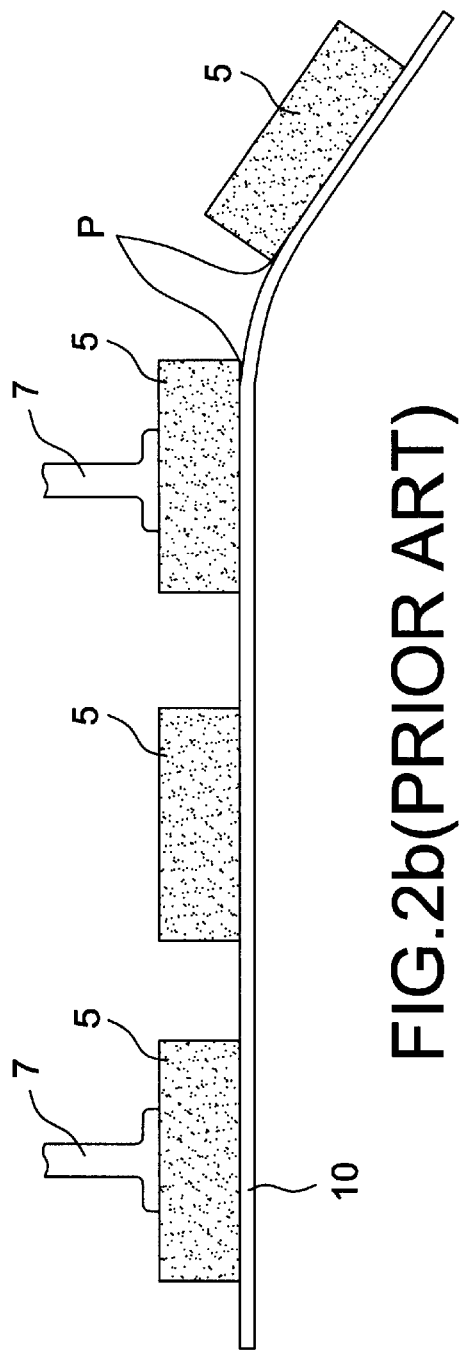
FIG. 2b is a schematic sectional view of the molded product of FIG. 2a sucked by suckers showing the warpage of the flexible substrate wherein the molded product is transferred from one processing station to another.
Figure 2A:
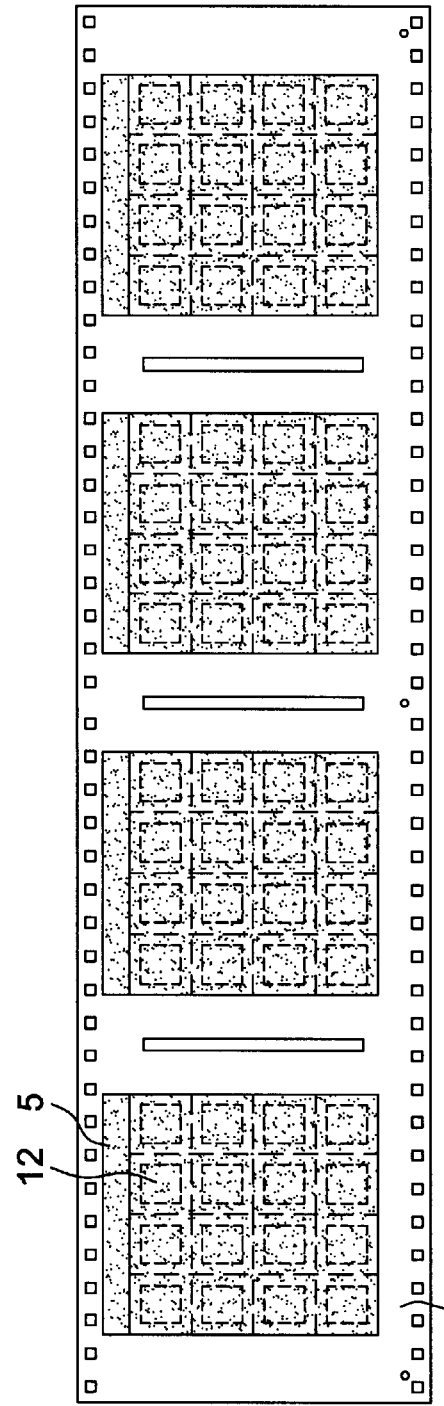
FIG. 2a is a top plan view of a molded product removed from the molding apparatus of FIG. 1.
Figure 3:
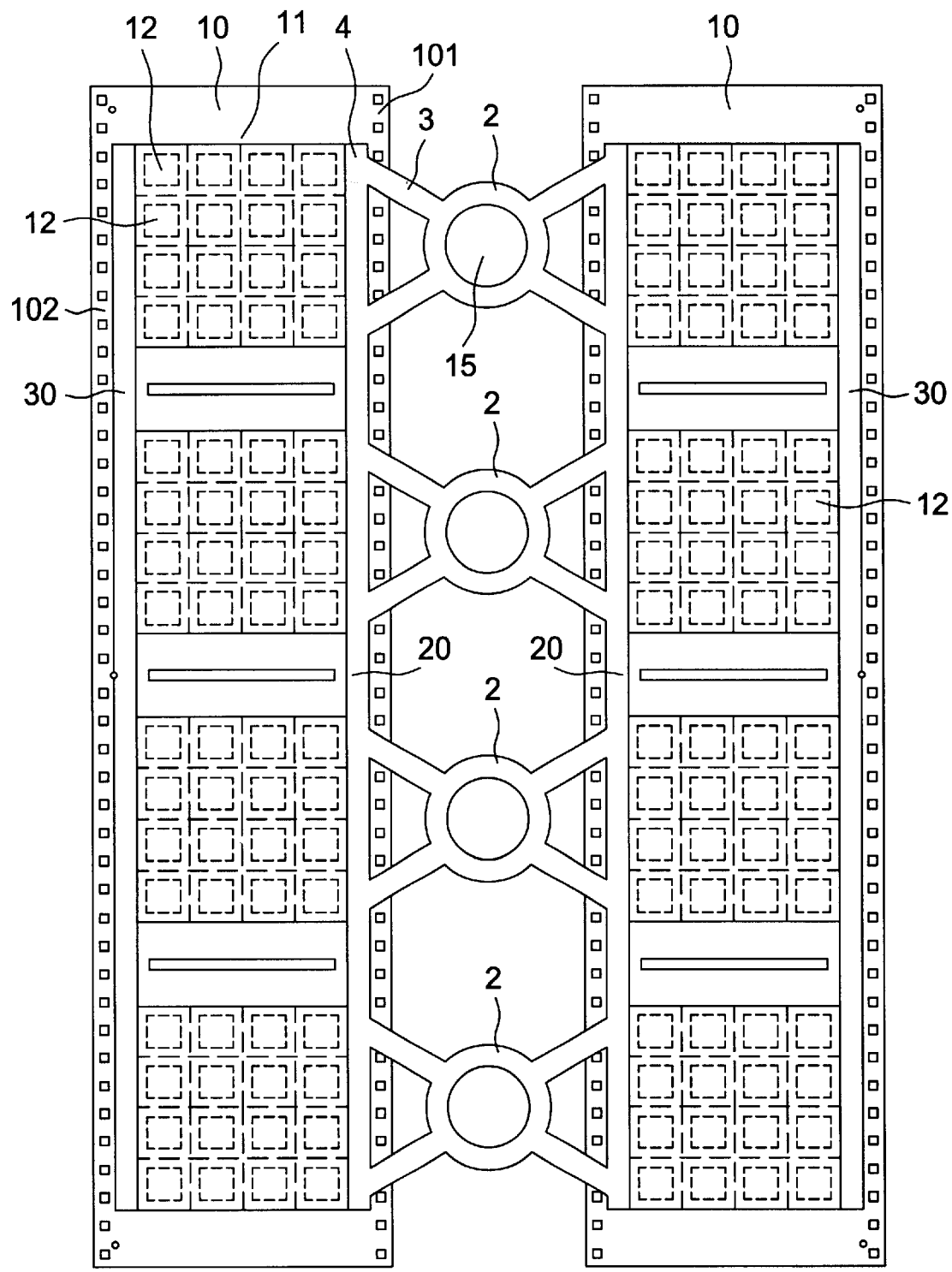
FIG. 3 is a top plan view of a plurality of sets of chips respectively mounted on two flexible substrates installed in a molding apparatus for a flexible substrate based BGA package in accordance with the present invention.

Referring to FIG. 3, the molding apparatus according to a preferred embodiment of the present invention comprises a plurality of pots 2. Two flexible substrates 10 are placed at two sides of the pots 2. A plurality of sets of chips 12 mounted on the upper surface of the flexible substrate 10 wherein each set of chips 12 are in an array arrangement. Each chip 12 is electrically connected to the substrate 10 by a plurality of bonding wires 13 (see FIG. 5). The molding apparatus further comprises a plurality of runners 3. Each runner 3 independently extends from one side of the pot 2 to a side 101 of the substrate 10, and connects to a cavity of a upper part 11 of a mold disposed on the substrate through a gate 4. Under the pressure created by a plunger, the molding compound is forced out of the pot 2 and then passes through the runner 3 and the gate 4 to enter the cavity of the upper part 11 of the mold. As shown in FIG. 3, the upper part 11 of the mold has eight cavities defined therein for accommodating eight sets of chips 12 in an array arrangement mounted on two substrates 10.

According to one embodiment of the present invention, the molding apparatus is provided with a first communication channel 20 formed corresponding to the side 101 of the substrate 10 in front of the gates 4 for interconnecting the cavities of the upper part 11 of the mold such that the molding compound inside each cavity of the upper part 11 of the mold can communicate one another. According to another embodiment of the present invention, the molding apparatus is further provided with a second communication channel 30 formed corresponding to the other side 102 of the substrate 10 for further interconnecting the cavities of the upper part 11 of the mold at the other sides thereof. Therefore, the molding compound inside each cavity of the upper part 11 of the mold can communicate with one another through the second communication channel 30. According to the molding apparatus of the present invention, the main purpose of the communication channels 20, 30 is to interconnect the cavities of the upper part 11 of the mold such that the molding compound inside each cavity of the upper part 11 of the mold can communicate one another. Therefore, the communication channels 20, 30 can act independently or cooperatively to fulfill the purpose described above.

Figure 4:
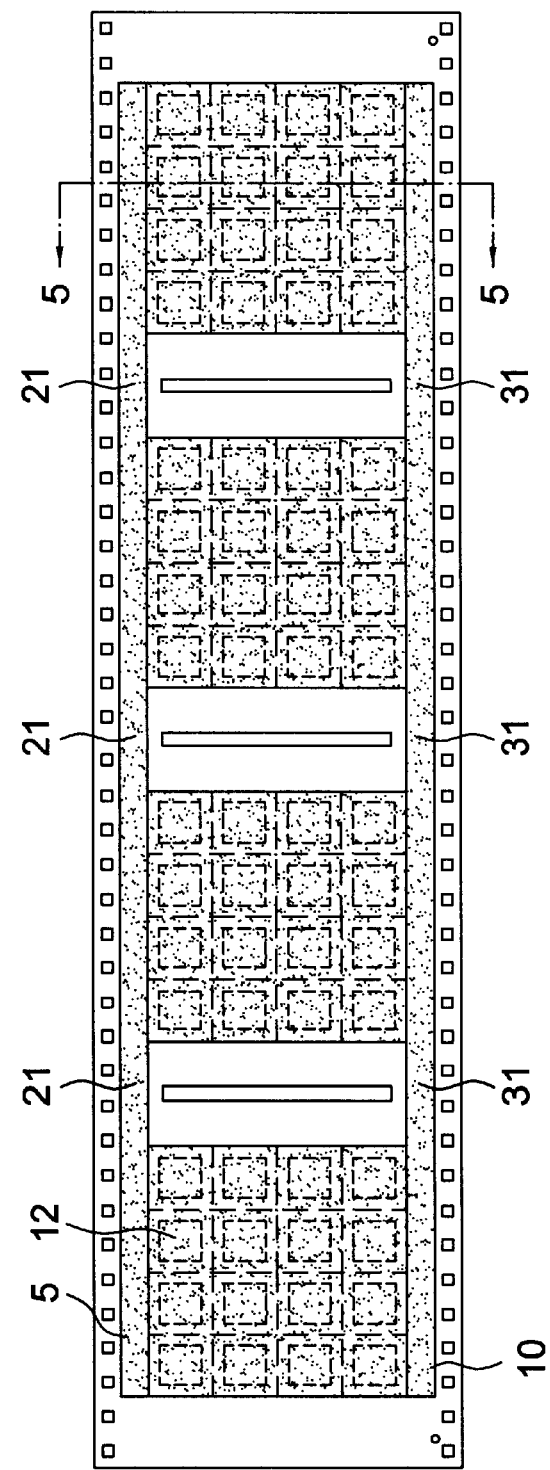
FIG. 4 is a top plan view of a molded product of the present invention removed from the molding apparatus of FIG. 3.

Referring to FIG. 4, the present invention characterized in that the molded product removed from the mold has a first connection bar 21 and a second connection bar 31, which form interconnection at two opposite sides of each unit package body 5 formed on the substrate 10 thereby integrating all unit package bodies 5. Since the connection bars 21, 23 are formed of molding compound, the mechanical strength hereof is far stronger than that of the flexible substrate 10. The unit package bodies 5 on the substrate 10 are linked together by the connection bars 21, 23 to form an integral structure such that the mechanical strength of the molded product of the present invention is far stronger than that of conventional molded product. Therefore, it is rather easy to manipulate the molded product of the present invention during processing steps such as post-curing, marking, ball mounting and sawing. According to the molded product of the present invention, the main purpose of the connection bars 21, 23 is to interconnect the unit package bodies 5 on the substrate 10 for forming an integral structure. Therefore, the connection bars 21, 23 can act independently or cooperatively to fulfill the purpose described above.

Figure 5:
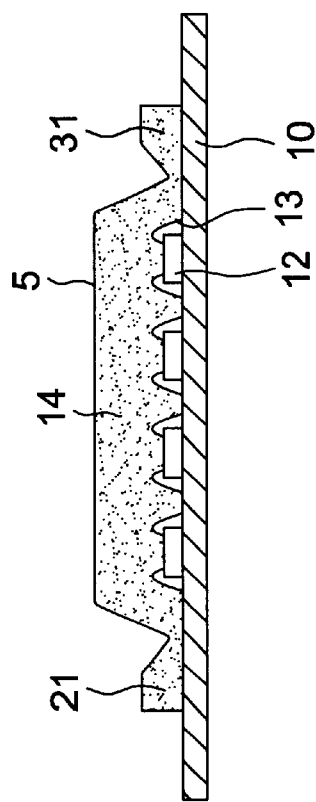
FIG. 5 is a cross sectional view taken from the line 5—5 of FIG. 4.

Referring to FIG. 5, the molded product of the present invention removed from the mold has a first connection bar 21 and a second connection bar 31, which form interconnection at two opposite sides of each unit package body 5 formed on the substrate 10. Preferably, the molded product of the present invention has neck portions formed at the junction between each of the connection bars 21, 23 and each of the unit package bodies 5. The neck portions help to release the stress due to CTE mismatch between the unit package bodies 5 and the substrate 10 thereby reducing warpage of the molded product.

Referring to FIG. 6, the molded product for used in forming a flexible substrate based package is removed from the mold. The two opposite sides of each unit package body 5 formed on the substrate 10 are respectively linked together by the connection bars 21, 23 thereby integrating all unit package bodies 5. Therefore, it is rather easy to manipulate the molded product of the present invention during processing steps such as post-curing, marking, ball mounting and sawing. Further, the strength of the molded product is significantly increased since two opposing connection bars respectively interconnect two opposite sides of each unit package body on the flexible substrate. This significantly suppresses peeling between the package body and the flexible thereby avoiding damaging the chip, traces on the flexible substrate, or bonding wires therebetween, and thereby improving the product yield. Further, peeling between the package body and the flexible substrate of the molded product of the present invention can be suppressed, thereby avoiding causing damage to the chip, traces on the flexible substrate, or bonding wires therebetween, and thereby improving the product yield.

Although the invention has been explained in relation to its preferred embodiment, it is to be understood that many other possible modifications and variations can be made without departing from the spirit and scope of the invention as hereinafter claimed.

What is claimed is:

1. A molding apparatus for use in forming a flexible substrate based package including a plurality of sets of chips in an array arrangement mounted on an upper surface of a substrate wherein each chip is electrically connected to the substrate, and the substrate has a first side and a second side opposing to the first side, wherein the molding apparatus comprising:

at least a pot for accommodating a molding compound;

at least two runners respectively extending from the pot to the first side of the substrate;

at least two gates disposed corresponding to the first side of the substrate;

at least two cavities formed corresponding to each set of the chips;

at least a plunger disposed in the pot for forcing the molding compound out of the pot and then passing through the runners and the gates to enter the cavities; and a first communication channel disposed corresponding to the first side of the substrate for providing interconnection between the cavities.

2. The molding apparatus as claimed in claim 1, further comprising a second communication channel disposed corresponding to the second side of the substrate for providing interconnection between the cavities.

\* \* \* \* \*